United States Patent
Park et al.

(10) Patent No.: US 11,165,034 B2
(45) Date of Patent: Nov. 2, 2021

(54) ORGANIC-INORGANIC HYBRID SOLAR CELL

(71) Applicant: LG Chem, Ltd., Seoul (KR)

(72) Inventors: Sang Jun Park, Daejeon (KR); Jaein Lee, Daejeon (KR); Seiyong Kim, Daejeon (KR); Jong Seok Kim, Daejeon (KR); Yongnam Kim, Daejeon (KR); Sang Kwon Lee, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/091,443

(22) PCT Filed: May 22, 2017

(86) PCT No.: PCT/KR2017/005272
§ 371 (c)(1),
(2) Date: Oct. 4, 2018

(87) PCT Pub. No.: WO2017/204506
PCT Pub. Date: Nov. 30, 2017

(65) Prior Publication Data
US 2019/0157013 A1 May 23, 2019

(30) Foreign Application Priority Data
May 23, 2016 (KR) .................. 10-2016-0062911

(51) Int. Cl.
*H01L 51/42* (2006.01)
*H01L 51/44* (2006.01)
(Continued)

(52) U.S. Cl.
CPC ........ *H01L 51/424* (2013.01); *H01L 51/0003* (2013.01); *H01L 51/0052* (2013.01);
(Continued)

(58) Field of Classification Search
CPC ............ H01L 51/0003; H01L 51/0077; H01L 51/0097; H01L 51/424; H01L 51/442;
(Continued)

(56) References Cited

U.S. PATENT DOCUMENTS 5,382,787 A 1/1995 Takada et al.
2014/0020738 A1 1/2014 Aida et al.
(Continued)

FOREIGN PATENT DOCUMENTS

CN 105576127 A 5/2016
CN 105591032 A 5/2016
(Continued)

OTHER PUBLICATIONS

International Search Report for PCT/KR2017/005272 dated Aug. 28, 2017.
(Continued)

*Primary Examiner* — Golam Mowla
(74) *Attorney, Agent, or Firm* — Lerner, David, Littenberg, Krumholz & Mentlik, LLP

(57) ABSTRACT

The present specification relates to an organic-inorganic hybrid solar cell including a first electrode, a first light absorbing layer provided on the first electrode, a second light absorbing layer provided on the first light absorbing layer, and a second electrode provided on the second light absorbing layer, in which the first light absorbing layer and the second light absorbing layer have different phase transition temperatures.

13 Claims, 2 Drawing Sheets

(51) Int. Cl.
*H01L 51/00* (2006.01)
*H01G 9/20* (2006.01)
*H01L 51/50* (2006.01)

(52) U.S. Cl.
CPC ...... *H01L 51/0054* (2013.01); *H01L 51/0077* (2013.01); *H01L 51/0097* (2013.01); *H01L 51/4233* (2013.01); *H01G 9/2063* (2013.01); *H01L 51/42* (2013.01); *H01L 51/442* (2013.01); *H01L 51/50* (2013.01); *H01L 2251/308* (2013.01); *Y02E 10/549* (2013.01)

(58) Field of Classification Search
CPC ............. H01L 51/4233; H01L 51/0052; H01L 51/0054; H01L 51/42; H01L 51/50; H01L 2251/308; H01L 51/4213; H01G 9/2063
See application file for complete search history.

(56) References Cited

U.S. PATENT DOCUMENTS

| | | |
|---|---|---|
| 2015/0340632 A1 | 11/2015 | Etgar |
| 2016/0005547 A1 | 1/2016 | Seok et al. |
| 2016/0225999 A1 | 8/2016 | Son et al. |
| 2017/0125171 A1 | 5/2017 | Lee et al. |

FOREIGN PATENT DOCUMENTS

| | | |
|---|---|---|
| EP | 3136450 A1 | 3/2017 |
| JP | H0520916 A | 1/1993 |
| JP | 2012222006 A | 11/2012 |
| KR | 20140091488 A | 7/2014 |
| KR | 20150122598 A | 11/2015 |
| KR | 20150124413 A | 11/2015 |
| KR | 101578875 B1 | 12/2015 |
| KR | 20150135202 A | 12/2015 |
| KR | 20150143010 A | 12/2015 |
| KR | 20160004220 A | 1/2016 |
| KR | 101607594 B1 | 3/2016 |
| WO | 2015167229 A1 | 11/2015 |

OTHER PUBLICATIONS

Liu J, Shirai Y, Yang X, Yue Y, Chen W, Wu Y, Islam A, Han L. High-Quality Mixed-Organic-Cation Perovskites from a Phase-Pure Non-stoichiometric Intermediate (FAI) 1-x-Pbl2 for Solar Cells. Advanced Materials. Sep. 2015;27(33):4918-23. XP-002789593.
Smith IC, Hoke ET, Solis-Ibarra D, McGehee MD, Karunadasa HI. A layered hybrid perovskite solar-cell absorber with enhanced moisture stability. Angewandte Chemie International Edition. Oct. 13, 2014;53(42):11232-5. XP55470470.
Extended European Search Report Including Written Opinion for EP17803025.0 dated Mar. 22, 2019.
Chinese Search Report for Application No. 201780023044.8 dated Aug. 12, 2021, 3 pages.

[Figure 1]
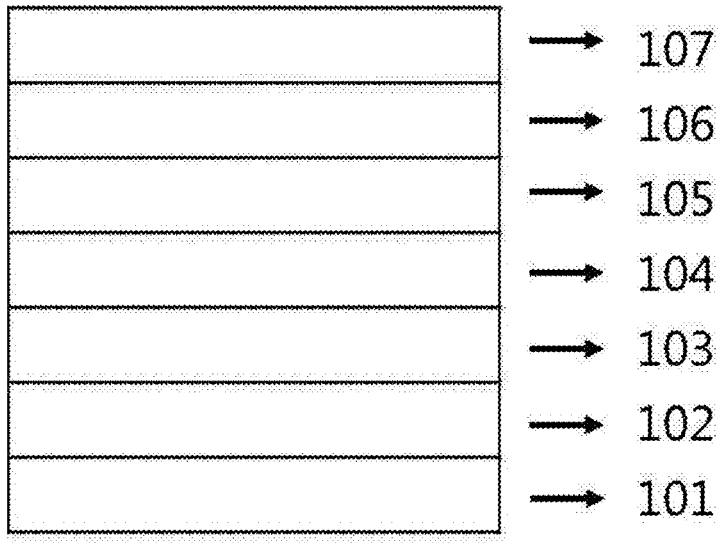
107
106
105
104
103
102
101
[Figure 2]
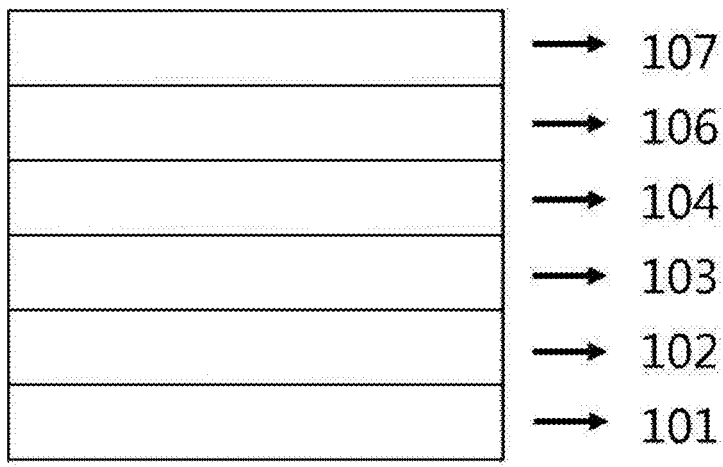
107
106
104
103
102
101
[Figure 3]
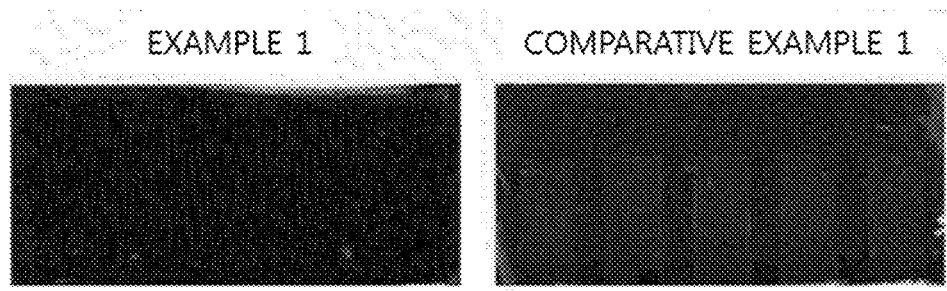

[Figure 4]
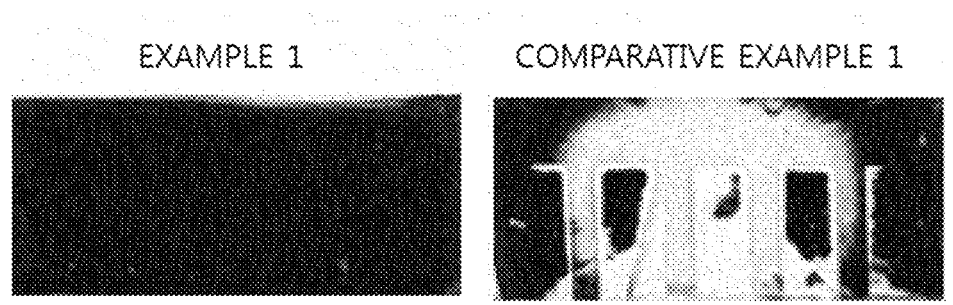
[Figure 5]
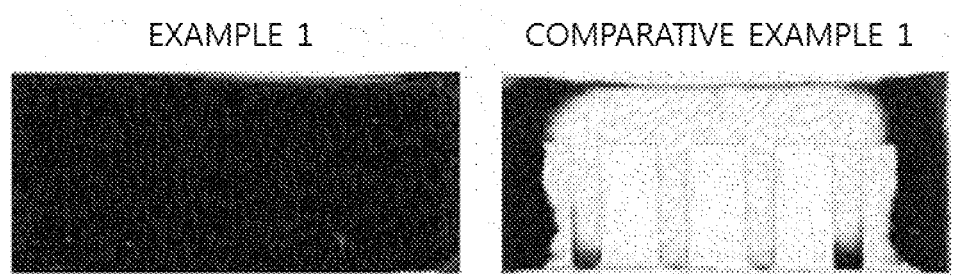
[Figure 6]
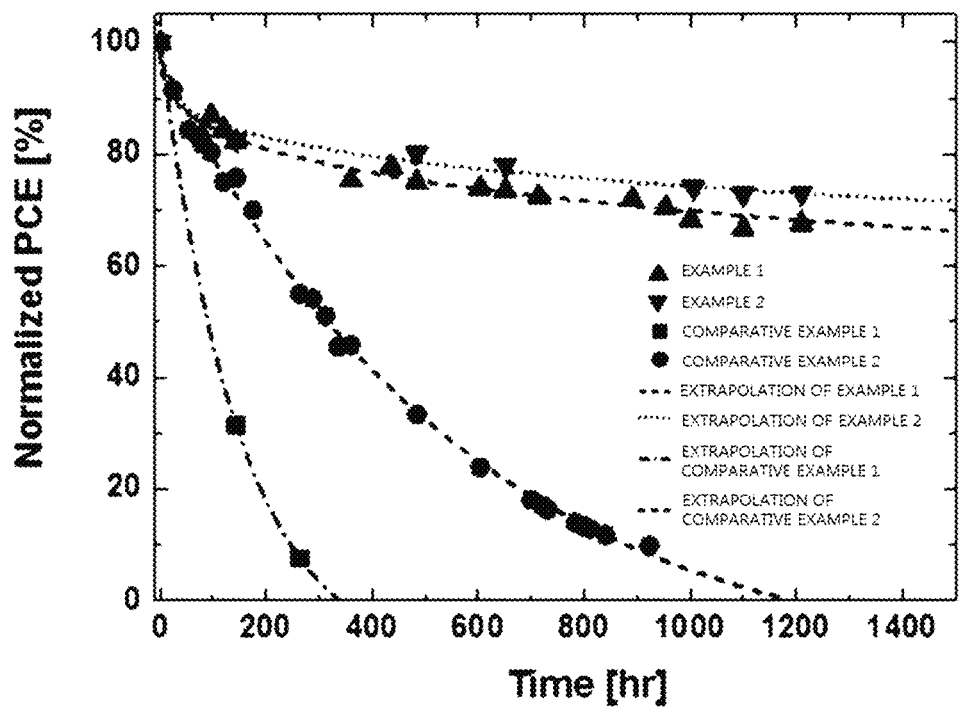

ORGANIC-INORGANIC HYBRID SOLAR CELL

CROSS-REFERENCE TO RELATED APPLICATIONS

The present application is a national phase entry under 35 U.S.C. § 371 International Application No PCT/KR2017/005272 filed May 22, 2017, which claims priority to Korean Patent Application No. 10-2016-0062911 filed May 23, 2016, the disclosures of which are incorporated herein by reference in their entirety.

TECHNICAL FIELD

The present specification relates to an organic-inorganic hybrid solar cell.

BACKGROUND ART

In order to solve the global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by absorbing photoenergy from the sunlight to use photovoltaic effects of generating electrons and holes.

Organic-inorganic hybrid perovskite materials have recently drawn attention as a light absorbing material for organic-inorganic hybrid solar cells due to the characteristics in which the absorption coefficient is high and the material can be easily synthesized through a solution process.

In general, the configuration of an absorption layer used in an organic-inorganic hybrid solar cell is composed of a single cation, a metal ion and a halogen ion as a basic structure which uses an $AMX_3$ component, but in this case, studies in which complex cation and halogen mixture ion groups are applied have been conducted due to low efficiency and stability problems.

However, in this case, there are problems in that the stability deteriorates and properties are changed due to the lattice spacing according to the phase transition which strongly depends on temperature.

DETAILED DESCRIPTION OF THE INVENTION

Technical Problem

The present specification provides an organic-inorganic hybrid solar cell having excellent stability and energy conversion efficiency.

Technical Solution

An exemplary embodiment of the present specification provides an organic-inorganic hybrid solar cell comprising:
a first electrode;
a first light absorbing layer provided on the first electrode;
a second light absorbing layer provided on the first light absorbing layer; and
a second electrode provided on the second light absorbing layer,
in which the first light absorbing layer and the second light absorbing layer have different phase transition temperatures, and
one of the first light absorbing layer and the second light absorbing layer comprises a compound having a perovskite structure represented by the following Chemical Formula 1 and the other comprises a compound having a perovskite structure represented by Chemical Formula 2.

$$AMX_3 \quad \text{[Chemical Formula 1]}$$

$$B_y B'_{(1-y)} M' X'_z X''_{(3-z)} \quad \text{[Chemical Formula 2]}$$

In Chemical Formula 1 or Chemical Formula 2,

B and B' are different from each other, and A, B, and B' are each independently a monovalent cation selected from $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M and M' are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X, X', and X" are the same as or different from each other, and are each independently a halogen ion, n is an integer from 1 to 9, $0<y<1$, and $0<z<3$.

Advantageous Effects

An organic-inorganic hybrid solar cell according to an exemplary embodiment of the present specification has an effect in that the crystal structure of a base layer serves as a binder of the upper layer crystal to suppress a lattice spacing phenomenon caused by a change in temperature, thereby enhancing the stability of a device.

Further, the organic-inorganic hybrid solar cell according to an exemplary embodiment of the present specification has an effect in that the interfacial characteristics are improved, and as a result, the current density and the energy conversion efficiency are increased.

In addition, the organic-inorganic hybrid solar cell according to an exemplary embodiment of the present specification can absorb a broad light spectrum, and thus has an effect in that the light energy loss is reduced, and the energy conversion efficiency is increased.

BRIEF DESCRIPTION OF DRAWINGS

FIG. 1 exemplifies a structure of an organic-inorganic hybrid solar cell according to an Example of the present specification.

FIG. 2 exemplifies a structure of an organic-inorganic hybrid solar cell according to a Comparative Example of the present specification.

FIG. 3 illustrates a state immediately after manufacturing the organic-inorganic hybrid solar cells manufactured in Example 1 and Comparative Example 1 of the present specification.

FIG. 4 illustrates a state 20 hours after manufacturing the organic-inorganic hybrid solar cells manufactured in Example 1 and Comparative Example 1 of the present specification.

FIG. 5 illustrates a state 50 hours after manufacturing the organic-inorganic hybrid solar cells manufactured in Example 1 and Comparative Example 1 of the present specification.

FIG. 6 illustrates a deterioration level in light efficiency according to the storage time of the organic-inorganic hybrid solar cell manufactured in an exemplary embodiment of the present specification.

101: Substrate
102: First electrode
103: Electron transporting layer
104: First light absorbing layer
105: Second light absorbing layer
106: Hole transporting layer
107: Second electrode Best Mode Hereinafter, the present specification will be described in detail.

When one part "comprise" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

An organic-inorganic hybrid solar cell according to an exemplary embodiment of the present specification comprises: a first electrode;

a first light absorbing layer provided on the first electrode;

a second light absorbing layer provided on the first light absorbing layer; and a second electrode provided on the second light absorbing layer, in which the first light absorbing layer and the second light absorbing layer have different phase transition temperatures, and one of the first light absorbing layer and the second light absorbing layer comprises a compound having a perovskite structure represented by the following Chemical Formula 1 and the other comprises a compound having a perovskite structure represented by Chemical Formula 2.

$$AMX_3 \quad \text{[Chemical Formula 1]}$$

$$B_yB'_{(1-y)}M'X'_zX''_{(3-z)} \quad \text{[Chemical Formula 2]}$$

In Chemical Formula 1 or Chemical Formula 2,

B and B' are different from each other, and A, B, and B' are each independently a monovalent cation selected from $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M and M' are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X, X', and X" are the same as or different from each other, and are each independently a halogen ion, n is an integer from 1 to 9,

0<y<1, and

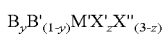0<z<3.

In an exemplary embodiment of the present specification, the light absorbing layer comprising the compound having the perovskite structure of Chemical Formula 1 has a phase transition temperature of 40° C. or more. Specifically, the light absorbing layer comprising the compound having the perovskite structure of Chemical Formula 1 may have a phase transition temperature of 40° C. to 80° C.

In an exemplary embodiment of the present specification, the light absorbing layer comprising the compound having the perovskite structure of Chemical Formula 2 has a phase transition temperature of −40° C. to 40° C. Specifically, the light absorbing layer comprising the compound having the perovskite structure of Chemical Formula 2 may have a phase transition temperature of 0° C. to 40° C. More specifically, the phase transition temperature may be 20° C. to 40° C.

For example, when the first light absorbing layer comprises the compound of Chemical Formula 1 and the second light absorbing layer comprises the compound of Chemical Formula 2, the first light absorbing layer may have a phase transition temperature of 40° C. or more, and the second light absorbing layer may have a phase transition temperature of −40° C. to 40° C. For another example, when the first light absorbing layer comprises the compound of Chemical Formula 2 and the second light absorbing layer comprises the compound of Chemical Formula 1, the first light absorbing layer may have a phase transition temperature of −40° C. to 40° C., and the second light absorbing layer may have a phase transition temperature of 40° C. or more.

In an exemplary embodiment of the present specification, the phase transition temperature of the light absorbing layer comprising the compound having the perovskite structure of Chemical Formula 1 is higher than that of the light absorbing layer comprising the compound having the perovskite structure of Chemical Formula 2. The phase transition temperature of the light absorbing layer comprising the compound having the perovskite structure of Chemical Formula 1 may be higher by 10° C. or more than that of the light absorbing layer comprising the compound having the perovskite structure of Chemical Formula 2. Specifically, the phase transition temperature of the light absorbing layer comprising the compound having the perovskite structure of Chemical Formula 1 may be higher by 20° C. or more than that of the light absorbing layer comprising the compound having the perovskite structure of Chemical Formula 2. More specifically, the phase transition temperature of the light absorbing layer comprising the compound having the perovskite structure of Chemical Formula 1 may be higher by 20° C. to 50° C. than that of the light absorbing layer comprising the compound having the perovskite structure of Chemical Formula 2.

For example, when the first light absorbing layer comprises the compound having the perovskite structure of Chemical Formula 1 and the second light absorbing layer comprises the compound having the perovskite structure of Chemical Formula 2, the phase transition temperature of the first light absorbing layer may be higher by 10° C. or more than that of the second light absorbing layer.

In the present specification, the compound having the perovskite structure of Chemical Formula 1 includes a single cation. In the present specification, the single cation means that one kind of cation is used. That is, for A in Chemical Formula 1, only one kind of monovalent cation is selected.

In an exemplary embodiment of the present specification, A in Chemical Formula 1 may be $C_nH_{2n+1}NH_3^+$, and n may be an integer from 1 to 9.

In the present specification, the compound having the perovskite structure of Chemical Formula 2 includes a complex cation. In the present specification, the complex cation means that two or more kinds of cations are used. That is, for B and B' in Chemical Formula 2, different monovalent cations are selected.

In an exemplary embodiment of the present specification, B and B' in Chemical Formula 2 may be $C_nH_{2n+1}NH_3^+$ and $HC(NH_2)_2^+$, respectively, and n may be an integer from 1 to 9.

In an exemplary embodiment of the present specification, M and M' may be $Pb^{2+}$.

In an exemplary embodiment of the present specification, the first light absorbing layer may be $C_nH_{2n+1}NH_3PbI_3$, the second light absorbing layer may be $(C_nH_{2n+1}NH_3)_y(HC(NH_2)_2)_{(1-y)}PbI_3$, and n may be an integer from 1 to 9. Specifically, the first light absorbing layer may be $CH_3NH_3PbI_3$ (methylammonium lead iodide, $MAPbI_3$), and the second light absorbing layer may be $(CH_3NH_3)_y(HC(NH_2)_2)_{(1-y)}PbI_3$.

In an exemplary embodiment of the present specification, the first light absorbing layer may be $(C_nH_{2n+1}NH_3)_y(HC(NH_2)_2)_{(1-y)}PbI_3$, n may be an integer from 1 to 9, and the second light absorbing layer may be $C_nH_{2n+1}NH_3PbI_3$. Specifically, the first light absorbing layer may be $(CH_3NH_3)_y(HC(NH_2)_2)_{(1-y)}PbI_3$, and the second light absorbing layer may be $CH_3NH_3PbI_3$.

In general, a light absorbing layer composed of the single layer has problems in that the stability deteriorates and the properties are changed due to the lattice spacing according to the phase transition which strongly depends on temperature. The present specification has an effect in that while the light absorbing layer is a light absorbing layer having a two-layer structure, the phase transition temperatures of the first light absorbing layer and the second light absorbing layer are different from each other, such that the crystal structure of the first light absorbing layer serves as a binder when the absorbing layer crystal of the second light absorbing layer is formed, and as a result, the lattice spacing caused by phase transition does not occur. Accordingly, the structural stability may be secured.

Further, in the present specification, the case where a single cation is used in the first light absorbing layer and a complex cation is used in the second light absorbing layer, or a complex cation is used in the first light absorbing layer and a single cation is used in the second light absorbing layer has a better effect in terms of energy conversion efficiency and stability than the case where a single cation is used in the first light absorbing layer and the second light absorbing layer, or a complex cation is used in the first light absorbing layer and the second light absorbing layer.

For example, in the present specification, by forming the light absorbing layer as a double layer using $CH_3NH_3PbI_3$ in the first light absorbing layer and $(CH_3NH_3)_y(HC(NH_2)_2)_{(1-y)}PbI_3$ in the second light absorbing layer or forming the light absorbing layer as a double layer using $(CH_3NH_3)_y(HC(NH_2)_2)_{(1-y)}PbI_3$ in the first light absorbing layer and $CH_3NH_3PbI_3$ in the second light absorbing layer, the absorbance in a region of about 770 nm to about 810 nm is increased as compared to the case where only a $MAPbI_3$ single layer is used as the light absorbing layer, and accordingly, it is possible to exhibit an effect of reducing the light energy loss and increasing the energy conversion efficiency. Further, the charge extraction ability is improved by reducing the bonds on the surface of the $HC(NH_2)_2PbI_3$ layer as compared to the case where the $HC(NH_2)_2PbI_3$ (formamidinium lead iodide, $FAPbI_3$) layer as a single layer, and as a result, there is an effect of improving the voltage of the solar cell and improving the energy conversion efficiency.

In the present specification, the phase transition temperature means a temperature at which inorganic ions move from a phase to another phase. For example, the phase transition temperature of $CH_3NH_3PbI_3$ may mean a temperature at which $CH_3NH_3PbI_3$ changes from a cubic structure to a tetragonal structure. In this case, the phase transition temperature of $CH_3NH_3PbI_3$ is about 54° C. As another example, a temperature at which $HC(NH_2)_2PbI_3$ changes from a trigonal structure to a hexagonal structure may be defined as the phase transition temperature. In this case, the phase transition temperature of $HC(NH_2)_2PbI_3$ is about 20° C.

In an exemplary embodiment of the present specification, the first light absorbing layer has a thickness of 1 nm to 100 nm. In this case, there is an effect of aligning the energy level with a common layer and serving as a base layer of the second light absorbing layer.

In the present specification, the thickness of the first light absorbing layer means a width between the surface on which the first light absorbing layer is brought into contact with the first electrode and the surface on which the first light absorbing layer is brought into contact with the second light absorbing layer.

In an exemplary embodiment of the present specification, the second light absorbing layer has a thickness of 1 nm to 600 nm. In this case, there is an effect of serving as a main light absorbing layer and reducing the surface defects of the first light absorbing layer.

In the present specification, the thickness of the second light absorbing layer means a width between the surface on which the second light absorbing layer is brought into contact with the first light absorbing layer and the surface on which the second light absorbing layer is brought into contact with the second electrode.

In the present specification, the first light absorbing layer and the second light absorbing layer may be formed by spin coating, slit coating, dip coating, inkjet printing, gravure printing, spray coating, doctor blade, bar coating, brush painting, and a thermal deposition method.

In the present specification, the organic-inorganic hybrid solar cell may further include a substrate. Specifically, the substrate may be provided at the lower portion of the first electrode.

In an exemplary embodiment of the present specification, the organic-inorganic hybrid solar cell may further include an electron transporting layer or a hole transporting layer between a first electrode and a first light absorbing layer.

In an exemplary embodiment of the present specification, the organic-inorganic hybrid solar cell may further include an electron transporting layer or a hole transporting layer between a second electrode and a second light absorbing layer.

For example, in the organic-inorganic hybrid solar cell of the present specification, a substrate, a first electrode, an electron transporting layer, a first light absorbing layer, a second light absorbing layer, a hole transporting layer, and a second electrode may be sequentially provided. In the case of the aforementioned structure, the thickness of the first light absorbing layer means a width between the surface on which the first light absorbing layer is brought into contact with the electron transporting layer and the surface on which the first light absorbing layer is brought into contact with the second light absorbing layer.

For another example, in the organic-inorganic hybrid solar cell of the present specification, a substrate, a first electrode, a hole transporting layer, a first light absorbing layer, a second light absorbing layer, an electron transporting layer, and a second electrode may be sequentially provided. In the case of the aforementioned structure, the thickness of the first light absorbing layer means a width between the surface on which the first light absorbing layer is brought into contact with the hole transporting layer and the surface on which the first light absorbing layer is brought into contact with the second light absorbing layer.

FIG. 1 exemplifies a structure of an organic-inorganic hybrid solar cell according to an exemplary embodiment of the present specification. Specifically, FIG. 1 exemplifies the structure of an organic-inorganic hybrid solar cell in which an electron transporting layer is provided on a first electrode, a first light absorbing layer is provided on the electron transporting layer, a second light absorbing layer is provided on the first light absorbing layer, a hole transporting layer is provided on the second light absorbing layer, and a second electrode is provided on the hole transporting layer. The organic-inorganic hybrid solar cell according to the present specification is not limited to the stacking structure in FIG. 1, and may further include an additional member.

In the present specification, as the substrate, it is possible to use a substrate having excellent transparency, surface smoothness, handling easiness, and waterproof property. Specifically, a glass substrate, a thin film glass substrate, or a plastic substrate may be used. The plastic substrate may include a film such as polyethylene terephthalate (PET), polyethylene naphthalate (PEN), polyether ether ketone, and polyimide in the form of a single layer or multi-layers. However, the substrate is not limited thereto, and a substrate typically used for an organic-inorganic hybrid solar cell may be used.

In the present specification, the first electrode may be an anode, and the second electrode may be a cathode. Further, the first electrode may be a cathode, and the second electrode may be an anode.

In the present specification, the first electrode may be a transparent electrode, and the solar cell may absorb light by way of the first electrode.

In the present specification, when the electrode is a transparent electrode, as the electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate.

Specifically, the electrode may be indium tin oxide (ITO), fluorine doped tin oxide (FTC)), aluminum doped zinc oxide (AZO), indium zinc oxide (IZO), ZnO—$Ga_2O_3$, ZnO—$Al_2O_3$, antimony tin oxide (ATO), and the like, and more specifically, ITO.

Furthermore, the first electrode may be a semi-transparent electrode. When the first electrode is a semi-transparent electrode, the electrode may be manufactured of a semi-transparent metal such as silver (Ag), gold (Au), magnesium (Mg), or an alloy thereof. When a semi-transparent metal is used as a first electrode, the organic-inorganic hybrid solar cell may have a micro cavity structure.

In the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), and palladium (Pd).

In the present specification, the organic-inorganic hybrid solar cell may have an inverted structure. When the organic-inorganic hybrid solar cell according to the present specification has an inverted structure, the second electrode may be a metal electrode. Specifically, when the solar cell according to an exemplary embodiment of the present specification has an inverted structure, the second electrode may include gold (Au), silver (Ag), aluminum (Al), $MoO_3$/Au, $MoO_3$/Ag, $MoO_3$/Al, $V_2O_5$/Au, $V_2O_5$/Ag, or $V_2O_5$/Al.

In the present specification, the organic-inorganic hybrid solar cell may have a normal structure. When the solar cell according to the present specification has a normal structure, the second electrode may be a metal electrode.

In the present specification, the solar cell may further include an additional layer provided between the first electrode and the second electrode. Specifically, according to an exemplary embodiment of the present specification, the additional layer may include one or more selected from the group consisting of a hole injection layer, a hole transporting layer, an electron blocking layer, an electron transporting layer, and an electron injection layer.

In the present specification, the hole transporting layer material and/or the electron transporting layer material may be a material which increases the probability that charges produced move to an electrode by efficiently transferring electrons and holes to a light absorbing layer, but are/is not particularly limited.

In the present specification, the electron transporting layer may include a metal oxide. As the metal oxide, it is possible to specifically use one or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, SrTi oxide, and a composite thereof, but the metal oxide is not limited thereto.

In the present specification, the electron transporting layer may improve characteristics of charges by using doping, and may modify the surface by using a fluorene derivative, and the like.

In the present specification, the electron transporting layer may be formed by using sputtering, E-Beam, thermal deposition, spin coating, screen printing, inkjet printing, doctor blade, or a gravure printing method to apply the material on one surface of a first electrode or coat the material in the form of a film.

According to an exemplary embodiment of the present specification, the hole transporting layer may be an anode buffer layer.

In the present specification, the hole transporting layer may be introduced by a method such as spin coating, dip coating, inkjet printing, gravure printing, spray coating, doctor blade, bar coating, gravure coating, brush painting, and thermal deposition.

The hole transporting layer may use tertiary butyl pyridine (TBP), lithium bis(trifluoro methanesulfonyl)imide (Li-TFSI), poly(3,4-ethylenedioxythiophene):poly(4-styrenesulfonate) [PEDOT:PSS], and the like, but the material is not limited thereto.

In the present specification, the organic-inorganic hybrid solar cell may have a winding structure. Specifically, the solar cell can be manufactured in the form of a flexible film, and may be made as a solar cell having a hollow winding structure by rolling the flexible film into a cylindrical form. When the solar cell has a winding structure, it is possible to install the solar cell in a way in which the solar cell is erected on the ground. In this case, it is possible to secure a portion in which the incident angle of light becomes a maximum while the sun moves from the east to the west at the position in which the solar cell is installed. Accordingly, while the sun is up in the sky, there is an advantage in that light may be absorbed as much as possible to increase the efficiency.

Mode for Invention

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Example 1

An organic substrate (40 Ω/sq) coated with indium tin oxide (ITO) was washed in ethanol for 20 minutes by using ultrasonic wave. A first electrode including a conductive transparent base material was manufactured by spin-coating a solution including zinc oxide (ZnO) on the ITO substrate. An ITO substrate coated with a ZnO film (hereinafter, referred to as an electron transporting layer) was manufactured by heat-treating the first electrode at 150° C. for about 30 minutes.

In order to form a first light absorbing layer, a dimethylformamide (DMF) solution in which $PbI_2$ at a concentration of about 40 wt % was dissolved was spin-coated on the electron transporting layer. Thereafter, a first light absorbing layer was formed by spin-coating an isopropyl alcohol (IPA) solution in which $CH_3NH_3I$(MAI) at a concentration of 1 wt % was dissolved, and performing a heat treatment at 80° C. for 30 minutes.

A second light absorbing layer was formed by spin-coating an isopropyl alcohol solution in which $(HC(NH_2)_2)_{0.85}(CH_3NH_3)_{0.15}I$ at a concentration of 5 wt % was dissolved on the upper portion of the first light absorbing layer, and then performing a heat treatment at 100° C. for 30 minutes.

A hole transporting layer was formed by spin-coating a solution including 0.17 M of spiro-MeOTAD, 0.198 M of tertiary butyl pyridine (TBP), and 64 mM of lithium bis (trifluoro methanesulfonyl)imide (Li-TFSI) on the second light absorbing layer. At this time, Li-TFSI was dissolved in acetonitrile at a concentration of 0.1977 g/mL, and then added in a solution state thereto.

Silver (Ag) was deposited to a thickness of about 120 nm to about 150 nm on the hole transporting layer under a pressure of $10^{-8}$ torr or less to form a second electrode, thereby completing an organic-inorganic hybrid solar cell.

Example 2

An organic substrate (40 Ω/sq) coated with indium tin oxide (ITO) was washed in ethanol for 20 minutes by using ultrasonic wave. A first electrode including a conductive transparent base material was manufactured by spin-coating a solution including zinc oxide (ZnO) on the ITO substrate. An ITO substrate coated with a ZnO film (hereinafter, referred to as an electron transporting layer) was manufactured by heat-treating the first electrode at 150° C. for about 30 minutes.

In order to form a first light absorbing layer, a dimethylformamide (DMF) solution in which $PbI_2$ at a concentration of about 40 wt % was dissolved was spin-coated on the electron transporting layer. Thereafter, a first light absorbing layer was formed by spin-coating an isopropyl alcohol solution in which $(HC(NH_2)_2)_{0.85}(CH_3NH_3)_{0.15}I$ at a concentration of 1 wt % was dissolved, and performing a heat treatment at 100° C. for 30 minutes.

A second light absorbing layer was formed by spin-coating an isopropyl alcohol (IPA) solution in which $CH_3NH_3I$(MAI) at a concentration of 5 wt % was dissolved on the first light absorbing layer, and performing a heat treatment at 80° C. for 30 minutes.

A hole transporting layer was formed by spin-coating a solution including 0.17 M of spiro-MeOTAD, 0.198 M of tertiary butyl pyridine (TBP), and 64 mM of lithium bis (trifluoro methanesulfonyl)imide (Li-TFSI) on the second light absorbing layer. At this time, Li-TFSI was dissolved in acetonitrile at a concentration of 0.1977 g/mL, and then added in a solution state thereto.

Silver (Ag) was deposited to a thickness of about 120 nm to about 150 nm on the hole transporting layer under a pressure of $10^{-8}$ torr or less to form a second electrode, thereby completing an organic-inorganic hybrid solar cell.

Comparative Example 1

An organic substrate (40 Ω/sq) coated with indium tin oxide (ITO) was washed in ethanol for 20 minutes by using ultrasonic wave. A first electrode including a conductive transparent base material was manufactured by spin-coating a solution including zinc oxide (ZnO) on the ITO substrate. An ITO substrate coated with a ZnO film (hereinafter, referred to as an electron transporting layer) was manufactured by heat-treating the first electrode at 150° C. for about 30 minutes.

In order to form a light absorbing layer, a dimethylformamide (DMF) solution in which $PbI_2$ at a concentration of about 40 wt % was dissolved was spin-coated on the electron transporting layer. Thereafter, a light absorbing layer was formed by spin-coating an isopropyl alcohol (IPA) solution in which $HC(NH_2)_2I$(FAI) at a concentration of 4 wt % was dissolved, and then performing a heat treatment at 100° C. for 30 minutes.

A hole transporting layer was formed by spin-coating a solution including 0.17 M of spiro-MeOTAD, 0.198 M of tertiary butyl pyridine (TBP), and 64 mM of lithium bis (trifluoro methanesulfonyl)imide (Li-TFSI) on the light absorbing layer. At this time, Li-TFSI was dissolved in acetonitrile at a concentration of 0.1977 g/mL, and then added in a solution state thereto.

Silver (Ag) was deposited to a thickness of about 120 nm to about 150 nm on the hole transporting layer under a pressure of $10^{-8}$ torr or less to form a second electrode, thereby completing an organic-inorganic hybrid solar cell.

Comparative Example 2

An organic substrate (40 Ω/sq) coated with indium tin oxide (ITO) was washed in ethanol for 20 minutes by using ultrasonic wave. A first electrode including a conductive transparent base material was manufactured by spin-coating a solution including zinc oxide (ZnO) on the ITO substrate. An ITO substrate coated with a ZnO film (hereinafter, referred to as an electron transporting layer) was manufactured by heat-treating the first electrode at 150° C. for about 30 minutes.

In order to form a first light absorbing layer, a dimethylformamide (DMF) solution in which $PbI_2$ at a concentration of about 40 wt % was dissolved was spin-coated on the electron transporting layer. Thereafter, a first light absorbing layer was formed by spin-coating an isopropyl alcohol (IPA) solution in which $CH_3NH_3I$(MAI) at a concentration of 1 wt % was dissolved, and performing a heat treatment at 80° C. for 30 minutes.

A second light absorbing layer was formed by spin-coating an isopropyl alcohol solution in which $HC(NH_2)_2I$ (FAI) at a concentration of 5 wt % was dissolved on the upper portion of the first light absorbing layer, and then performing a heat treatment at 100° C. for 30 minutes.

A hole transporting layer was formed by spin-coating a solution including 0.17 M of spiro-MeOTAD, 0.198 M of tertiary butyl pyridine (TBP), and 64 mM of lithium bis (trifluoro methanesulfonyl)imide (Li-TFSI) on the second light absorbing layer. At this time, Li-TFSI was dissolved in acetonitrile at a concentration of 0.1977 g/mL, and then added in a solution state thereto.

Silver (Ag) was deposited to a thickness of about 120 nm to about 150 nm on the hole transporting layer under a pressure of $10^{-8}$ torr or less to form a second electrode, thereby completing an organic-inorganic hybrid solar cell.

Table 1 shows the performances immediately after and 50 hours after manufacturing the organic-inorganic hybrid solar cells according to Example 1 and Comparative Example 1.

TABLE 1

| | Time | PCE (%) | $J_{sc}$ (mA/cm$^2$) | $V_{oc}$ (V) | FF (%) |
|---|---|---|---|---|---|
| Example 1 | Immediately after manufacturing | 11.5 | 19.0 | 0.91 | 65.3 |
| | 50 hours after manufacturing | 9.3 | 15.3 | 0.93 | 65.8 |
| Comparative Example 1 | Immediately after manufacturing | 10.3 | 15.9 | 1.02 | 63.4 |
| | 50 hours after manufacturing | 3.2 | 5.85 | 0.097 | 63.9 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

It can be confirmed that the organic-inorganic hybrid solar cell according to Example 1 had a slight change in performance even after 50 hours, whereas the performance of the organic-inorganic hybrid solar cell according to Comparative Example 1 deteriorated after 50 hours.

FIGS. 3 to 5 illustrate the organic-inorganic hybrid solar cells according to exemplary embodiments of the present specification over time. It can be confirmed that the organic-inorganic hybrid solar cell according to Example 1 had no change even after time elapsed, whereas the organic-inorganic hybrid solar cell according to Comparative Example 1 had a change in properties as time elapsed.

TABLE 2

| | Life span, LT70 (Time) |
|---|---|
| Example 1 | >1000 |
| Example 2 | >1000 |
| Comparative Example 1 | <100 |
| Comparative Example 2 | <200 |

FIG. 6 and Table 2 show a deterioration level in light efficiency over the storage time of the organic-inorganic hybrid solar cells according to exemplary embodiments of the present specification. It can be confirmed that for the devices in Comparative Example 1 and Comparative Example 2, the time (LT70) for reaching efficiency which is 70% level as compared to the initial efficiency is less than 200 hours, whereas the efficiency of the devices in Example 1 and Example 2 dropped to a 70% level compared to the initial efficiency at the time which is 5 times to 10 times or more than Comparative Example 1 and Comparative Example 2, or showed a deterioration level or less than the aforementioned deterioration level.

The invention claimed is:

1. An organic-inorganic hybrid solar cell comprising:
a first electrode;
a first light absorbing layer provided on the first electrode;
a second light absorbing layer provided on the first light absorbing layer; and
a second electrode provided on the second light absorbing layer,
wherein the first light absorbing layer and the second light absorbing layer have different phase transition temperatures, and
one of the first light absorbing layer and the second light absorbing layer comprises a compound having a perovskite structure represented by the following Chemical Formula 1 and the other comprises a compound having a perovskite structure represented by the following Chemical Formula 2:

$$AMX_3 \qquad \text{[Chemical Formula 1]}$$

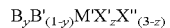

$$B_yB'_{(1-y)}M'X'_zX''_{(3-z)} \qquad \text{[Chemical Formula 2]}$$

In Chemical Formula 1 or Chemical Formula 2,
B and B' are different from each other, A and B are the same as each other, and A, B, and B' are each independently a monovalent cation selected from $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M and M' are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$,
X, X', and X" are the same as or different from each other, and are each independently a halogen ion,
n is an integer from 1 to 9,
$0<y<1$, and
$0<z<3$,
wherein the phase transition temperature of the light absorbing layer comprising the compound having the perovskite structure of Chemical Formula 1 is higher by 20° C. to 50° C. than that of the light absorbing layer comprising the compound having the perovskite structure of Chemical Formula 2, and
wherein an energy conversion efficiency of the organic-inorganic hybrid solar cell is at least 80% after storage for 200 hours.

2. The organic-inorganic hybrid solar cell of claim 1, wherein the phase transition temperature of the light absorbing layer comprising the compound having the perovskite structure of Chemical Formula 1 is 40° C. or more.

3. The organic-inorganic hybrid solar cell of claim 1, wherein the phase transition temperature of the light absorbing layer comprising the compound having the perovskite structure of Chemical Formula 2 is −40° C. to 40° C.

4. The organic-inorganic hybrid solar cell of claim 1, wherein the first light absorbing layer has a thickness of 1 nm to 100 nm.

5. The organic-inorganic hybrid solar cell of claim 1, wherein the second light absorbing layer has a thickness of 1 nm to 600 nm.

6. The organic-inorganic hybrid solar cell of claim 1, wherein A is $C_nH_{2n+1}NH_3^+$, and n is an integer from 1 to 9.

7. The organic-inorganic hybrid solar cell of claim 1, wherein B is $C_nH_{2n+1}NH_3^+$ and B' is $HC(NH_2)_2^+$, and n is an integer from 1 to 9.

8. The organic-inorganic hybrid solar cell of claim 1, wherein M and M' are $Pb^{2+}$.

9. The organic-inorganic hybrid solar cell of claim 1, wherein the first light absorbing layer is $C_nH_{2n+1}NH_3PbI_3$, the second light absorbing layer is $(CH_NH_{2n+1}NH_3)_y(HC(NH_2)_2)_{(1-y)}PbI_3$, n is an integer from 1 to 9, and 0<y<1.

10. The organic-inorganic hybrid solar cell of claim 1, wherein the first light absorbing layer is $(CH_nH_{2n+1}NH_3)_y(HC(NH_2)_2)_{(1-y)}PbI_3$, the second light absorbing layer is $C_nH_{2n+1}NH_3PbI_3$, n is an integer from 1 to 9, and 0<y<1.

11. The organic-inorganic hybrid solar cell of claim 1, further comprising:
an electron transporting layer or a hole transporting layer between the first electrode and the first light absorbing layer.

12. The organic-inorganic hybrid solar cell of claim 1, further comprising:
an electron transporting layer or a hole transporting layer between the second electrode and the second light absorbing layer.

13. The organic-inorganic hybrid solar cell of claim 1, wherein the energy conversion efficiency of the organic-inorganic hybrid solar cell is at least 60% after storage for 1000 hours.

* * * * *